United States Patent [19]

Kuno

[11] Patent Number: 4,646,268

[45] Date of Patent: Feb. 24, 1987

[54] SEMICONDUCTOR BIPOLAR MEMORY DEVICE OPERATING IN HIGH SPEED

[75] Inventor: Kazuo Kuno, Tokyo, Japan

[73] Assignee: NEC Corporation, Tokyo, Japan

[21] Appl. No.: 661,206

[22] Filed: Oct. 15, 1984

[30] Foreign Application Priority Data

Oct. 13, 1983 [JP] Japan .................................. 58-191471

[51] Int. Cl.$^4$ ............................................... G11C 7/00
[52] U.S. Cl. ..................................... 365/179; 365/189; 365/175
[58] Field of Search ............... 365/155, 179, 189, 175, 365/190

[56] References Cited

U.S. PATENT DOCUMENTS 4,479,200 10/1984 Sato et al. ....................... 365/179 X

FOREIGN PATENT DOCUMENTS

58-45696 3/1983 Japan .................................. 365/155

Primary Examiner—Joseph A. Popek
Attorney, Agent, or Firm—Burns, Doane, Swecker & Mathis

[57] ABSTRACT

A semiconductor memory device composed of bipolar transistors is disclosed. A read/write control circuit includes a voltage producing section which produces a reading-out voltage used for reading out the data stored in the selected memory cell. The voltage producing section includes a first transistor of an emitter follower type as its output stage, and the data-read operation is thus attained in a high speed. The voltage producing section further includes a diode whose ON voltage is substantially equal to that of a clamping diode provided in a memory cell and a second transistor having an emitter resistor and a collector resistor and supplying the collector resistor with a current determined by the ON voltage of the diode and the emitter resistor. The potential at the collector of the second transistor is applied to the first transistor.

8 Claims, 4 Drawing Figures

FIG. 4B

SEMICONDUCTOR BIPOLAR MEMORY DEVICE OPERATING IN HIGH SPEED

BACKGROUND OF THE INVENTION

The present invention relates to a semiconductor memory device constituted by bipolar transistors, and more particularly to a read/write control circuit controlling a data-read operation and a data-write operation.

In a semiconductor bipolar memory device, each of bipolar transistor memory cells includes first and second bipolar transistors of a multi-emitter type having first and second emitters, first and second load resistors, and first and second clamping diodes. The first emitters of the first and second transistors are connected in common to a data holding current source. The base and collector of the first transistor are connected to the collector and base of the second transistor, respectively. The first load resistor and clamping diode are connected in parallel between the collector of the first transistor and a word line, and the second load resistor and clamping diode are connected in parallel between the collector of the second transistor and the word line.

Assuming that the first and second transistors are made conductive and non-conductive, respectively, the data holding current flows through the first transistor. Accordingly, the collector voltage of the first transistor, i.e., the base voltage of the second transistor, is lower than the base-emitter threshold voltage of the second transistor to maintain the second transistor in a non-conductive state. Since no current flows through the second transistor, the collector voltage of the second transistor (i.e., the base voltage of the first transistor) is larger than the base-emitter threshold voltage of the first transistor. The first transistor is thereby held in a conductive state. This condition means that the data "1" is stored in the memory cell. On the contrary, the data "0" is stored in the cell when the first and second transistors are in the nonconductive and conductive states, respectively. The first and second clamping diodes are provided for suppressing the lowering of the collector potentials of the first and second transistors upon the data-read and data-write operations to attain a high speed operation, and therefore Schottky diode having a forward voltage lower than that of a p-n junction diode is employed for the first and second clamping diodes. When the clamping diode is turned on, the collector potential of the transistor is clamped to a potential that is obtained by subtracting the forward voltage of the clamping diode from the selective level of the word line. Upon the data holding condition, the level of the word line takes an unselective level and the current from the data holding current source is considerably small. Therefore, both of the first and second clamping diodes are turned off.

In order to read out the data stored in the memory cell, there is provided a data detection circuit which includes third and fourth transistors and first and second reading-out current sources. The emitter of the third transistor and the second emitter of the first transistor are connected in common to the first reading-out current source, and the emitter of the fourth transistor is connected to the second reading-out current source along with the second emitter of the second transistor. The difference in voltages between the collectors of the third and fourth transistors is amplified and then used as a read-out data output.

In the data-read operation, the read/write control circuit supplied a reading-out voltage to the bases of the third and fourth transistors. If the data "1" is stored in the selected memory cell, the first and second transistors are in the conductive state and in the non-conductive state, respectively. The increased current by the selective level on the word line thereby flows through the first transistor to enhance the voltage drop across the first load resistor. The first clamping diode is thus turned on. As a result, the potential at the collector of the first transistor (i.e., at the base of the second transistor) is clamped to a level that is obtained by subtracting the ON voltage of the first clamping diode from the selective level on the word line. On the other hand, the second load resistor is supplied with the base current of the first transistor, and hence its voltage drop is negligible. The base of the first transistor takes the selective level on the word line. Accordingly, the difference between the base potentials of the first and second transistors is substantially equal to the ON voltage (or forward voltage) of the clamping diode. In order to obtain the difference in voltage between the collectors of the third and second transistors, the reading-out voltage should take an intermediate level between the base potentials of the first and second transistors.

In a read/write control circuit according to the prior art, two resistors are provided in series between power supply terminals, and the reading-out voltage is derived from the connection point of these resistors. The potential of the reading-out voltage is thereby determined by the resistance ratio of the resistors and the power supply voltage applied between the power supply terminals. Since the resistance ratio of two or more resistors formed in an integrated circuit device can be designed with a considerable accuracy, the deviation in the potential of the reading-out voltage is very small. On the other hand, Schottky diodes are employed for the clamping diodes, and the forward voltage (ON voltage) of a Schottky diode is changed in a relatively wide range in accordance with the variation in the manufacturing process conditions. In other words, the difference between the base potentials of the first and second transistors is varied relatively. For this reason, the reading-out voltage often takes a potential that is out of the level range from the base potential of the first transistor to that of the second transistor.

In order to overcome such a shortcoming, a read/write control circuit has been proposed, in which the ON voltage (forward voltage) of Schottky diode is divided by at least two resistors and the divided voltage is used as the read-out voltage. More specifically, the same level as the selective level of the word line is applied to the anode of the Schottky diode whose cathode is connected to a constant current source. Two resistors are connected in series between the anode and cathode of the Schottky diode, and the potential at the connection point of the resistors is derived as the reading-out voltage. The current of the constant current source is designed to be equal to that of the reading-out current source, and the sum of the resistance values of the two resistors is choosen to take the same value of the road resistor in the memory cell. The ON voltage of the Schottky diode is thereby made substantially equal to that of the clamping diode in the memory cell. In addition, the change in ON voltage of the respective diodes caused by the variation in manufacturing process is made similar to each other. As a result, the reading-out voltage produced by this circuit arrangement takes an intermediate potential between the base potentials of the first and second transistors, irrespective of the variation in manufacturing process.

However, the charging and discharging the input capacitances of the third and fourth transistors and the stray capacitances of interconnection wiring layers are carried out through the two resistors connected in series between the anode and cathode of the Schottky diode. The load resistor in the memory cell has a resistance value of several tens kilo-ohms due to a low power consumption and a high speed operation, and therefore the resistance values of the two resistors for producing the reading-out voltage should be designed to several tens kilo-ohms. For this reason, the time constant for charging and discharging the input capacitances and stray capacitances becomes large, resulting in that the speed of the data-read operation is made slow.

SUMMARY OF THE INVENTION

It is, therefore, an object of the present invention to provide a semiconductor memory device having an improved control circuit for producing a reading-out voltage taking a predetermined potential.

Another object of the present invention is to provide a memory device having a read/write control circuit for performing a data-read operating in a high speed and producing a reading-out voltage taking a predetermined potential irrespective of the change in manufacturing process.

A memory device according to the present invention comprises a plurality of memory cells, each of the memory cells including first and second transistors for holding data stored therein and first and second diodes for suppressing a lowering of potentials of the transistors, and means for producing a reading-out voltage which is used for reading out the data stored in the selected memory cell, the producing means including means for generating a voltage having a level variation characteristic substantially equal to that of each voltage of the diodes, means for providing a current based on the voltage generated from the generating means, means for converting the current to a voltage, and means respective to the converted voltage for supplying the reading-out voltage with a low output impedance.

Ancording to a preferred embodiment, the generating means includes a third diode having a junction characteristic substantially equal to that of the first and second diodes in the memory cell, and the providing means includes a third transistor having an emitter resistor, a current flowing through the third transistor being determined by the voltage of the third diode and the emitter resistor. The converting means includes a resistor connected to the collector of the third transistor, and the supplying means includes a fourth transistor of an emitter follower type.

In the memory device according to the present invention, the producing means produces the reading-out voltage relative to the voltage of the first or second diode in the memory cell. Accordingly, the reading-out voltage takes a level that is changed in accordance with the variation in voltage of the first and second diodes. Further, the circuit constants of the providing means, converting meand and supplying means can be designed independently of those of the memory cells, and therefore the speed for the data-read operation is made fast.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PRIOR ART

Figure 1:
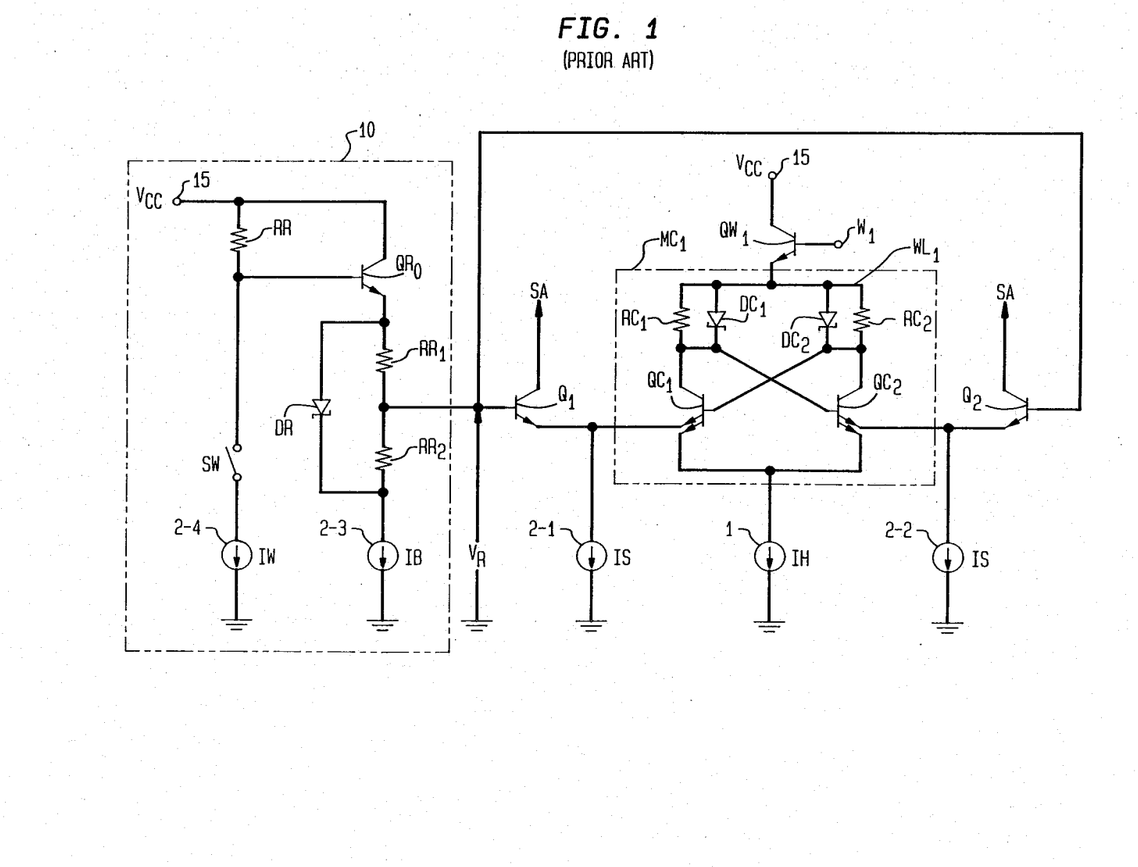
FIG. 1 is a circuit diagram showing a prior art.

Referring to FIG. 1, there is shown a voltage production part 10 in a read/write control circuit according to the prior art in order to facilitate the understanding of features and advantages of the present invention. There is further shown in FIG. 1 one memory cell $MC_1$. The memory cell $MC_1$ includes two transistors $QC_1$ and $QC_2$ of an NPN type. The base and collector of the transistor $QC_1$ are connected to the collector and base of the transistor $QC_2$ to form a flip-flop circuit. The transistors $QC_1$ and $QC_2$ are of a multi-emitter type having first and second emitters. The first emitters of the transistors $QC_1$ and $QC_2$ are connected in common to a constant current source 1 producing a data-holding current IH. A clamping diode $DC_1$ and a load resistor $RC_1$ are connected in parallel between the collector of the transistor $QC_1$ and a word line $WL_1$, and the collector of the transistor $QC_2$ is coupled to the word line $WL_1$ through a parallel circuit of a clamping diode $DC_2$ and a load resistor $RC_2$. Each of the clamping diodes $DC_1$ and $DC_2$ is formed by a Schottky diode for the purpose of a high speed operation. The word line $WL_1$ is connected to a first power supply terminal 15 through an NPN transistor $QW_1$ supplied at its base with a word line selection signal $W_1$. The terminal 15 is applied with a power voltage of $V_{CC}$.

The second emitter of the transistor $QC_1$ is connected along with the emitter of an NPN transistor $Q_1$ to a constant current source 2-1 producing a reading-out current IS, and the second emitter of the transistor $QC_2$ and emitter of an NPN transistor $Q_2$ are connected in common to a constant current source 2-2 which also produces a read-out current IS. The outputs at the collectors of the transistors $Q_1$ and $Q_2$ are supplied to a sense amplifier (not shown), and the data stored in the memory cell $MC_1$ is thereby read-out.

When the signal $W_1$ takes a selective level (being substantially equal to the $V_{CC}$ level), the memory cell $MC_1$ is selected, and the word line $WL_1$ thus takes a level of $(V_{CC}-V_{BE1})$, $V_{BE1}$ representing the base-emitter forward voltage of the transistor $QW_1$. If the data "1" has been stored in the memory cell $MC_1$, the transistors $QC_1$ and $QC_2$ are in a conductive state and in a nonconductive state, respectively. Accordingly, the increase current by the level-up on the word line $WL_1$ flows into the current source 2-1 through the transistor $QC_1$. The voltage drop across the resistor $RC_1$ is thus made large to turn the diode $DC_1$ on. As a result, the potential at the collector of the transistor $QC_1$ (i.e., the base potential of the transistor $QC_2$) is clamped to the level of $(V_{CC}-V_{BE1}-V_{F1})$, $V_{F1}$ being the forward voltage (or ON voltage) of the diode $DC_1$. On the other hand, the base current of the transistor $QC_1$ flows through the resistor $RC_2$, but the voltage drop across the resistor $RC_2$ is negligible. Therefore, the potential at base of the transistor $QC_1$ (or collector potential of the transistor $QC_2$) is substantially equal to the level of the word line $WL_1$, i.e., $(V_{CC}-V_{BE1})$.

The transistor $Q_1$ and $Q_2$ are supplied at their bases with a reading-out voltage $V_R$ from the voltage production part 10. If the voltage $V_R$ takes the intermediate level between the base potentials of the transistors $QC_1$ and $QC_2$, either one of the transistors $Q_1$ and $Q_2$ is made conductive to broaden the difference in voltage between the collectors of the transistors $QC_1$ and $QC_2$. The read-out operation for the stored data thus becomes possible. Accordingly, the voltage production part 10 should produce the intermediate level between the base potentials of the transistors $QC_1$ and $QC_2$, i.e., the following read-out voltage $V_R$:

$$V_r = V_{CC} - V_{BE1} - \tfrac{1}{2}V_{F1} \tag{1}$$

In order to produce the voltage $\dot{V}_R$ having this level, the voltage production part 10 includes an NPN transistor $QR_0$, three resistors $RR$, $RR_1$ and $RR_2$, a diode $DR$, two constant current sources 2-3 and 2-4, and a switch SW. The resistor $RR$, switch $SW$ and current source 2-4 are connected in series between the first power supply terminal 15 and a second power supply terminal which is grounded. The collector of the transistor $QR_0$ is connected to the terminal 15, and the base of the same is connected to the junction point of the resistor $RR$ and switch SW. The emitter of $QR_0$ is grounded through the diode DR and current source 2-3. The resistors $RR_1$ and $RR_2$ are connected in series between the anode and cathode of the diode DR. The voltage $V_R$ is derived from the connection point of the resistors $RR_1$ and $RR_2$.

Upon the data-read operation, the switch SW is brought into an open state. Accordingly, the voltage of $(V_{CC}-V_{BE0})$ appears at the emitter of the transistor $QR_0$, $V_{BE0}$ being the base-emitter forward voltage. The diode DR is biased by the current IB of the current source 2-3, and thereby produces the forward voltage of $V_{F0}$. The voltage at the connection point of the resistors $RR_1$ and $RR_2$ thus takes the level lowered by the voltage of $$\left(\frac{RR_2}{RR_1 + RR_2} \cdot V_{F0}\right)$$

from the emitter potential of the transistor $QR_0$. That is, the reading-out voltage $V_R$ takes the following level:

$$V_R = V_{CC} - V_{BE0} - \frac{RR_2}{RR_1 + RR_2} \cdot V_{F0} \tag{2}$$

The levels represented by the equations (1) and (2) are made equal to each other when the following conditions (i), (ii) and (iii) are satisfied:

(i) The diode DR is formed of Schottky diode, similarly to the diodes $DC_1$ and $DC_2$ in the memory cell.

(ii) $RR_1=RR_2$ and $RR_1+RR_2=RC_1$ ($=RC_2$)

(iii) The current IS of the current source 2-1 (2-2) is equal to the current IB of the current source 2-3.

The voltage production part 10 thus produces the reading-out voltage having the intermediate potential between the base potentials of the transistors $QC_1$ and $QC_2$.

The resistance values of the resistors $RC_1$ and $RC_2$ are selected to an adequate value from the viewpoints of data-holding characteristics, a high speed operation and a low power consumption. In a memory device having memory capacity of 1,024 bits, each of the resistors $RC_1$ and $RC_2$ is designed to have a resistance value of about 10 K$\Omega$, and in another memory device of 4096 bits, the values of the resistors $RC_1$ and $RC_2$ are choosen to 20 to 30 K$\Omega$. From the above-mentioned condition (ii), the resistance values of the resistors $RR_1$ and $RR_2$ are, therefore, selected to 5 K$\Omega$ in the first mentioned memory device or to 10 to 15 K$\Omega$ in the last mentioned memory device. As apparent from the circuit configuration shown in FIG. 1, the output impedance of the voltage production part 10 is represented as a parallel compound value of the resistors $RR_1$ and $RR_2$. Assuming that the total value of input capacitances of the transistor $Q_1$ and $Q_2$ and the stray capacitance of an interconnection wiring layer for applying the reading-out voltage is 3 pF, the time constant for reading out the data is as follows:

$$3[pF] \times 5[k\Omega]/2 = 7.5[nsec], \tag{3}$$

or $$3[pF] \times 10(15)[K\Omega]/2 = 15(22.5)[nsec] \tag{4}$$

One of the requirements of the bipolar memory device is a high speed operation, and the time constant for reading out the data should be designed to a value below 1 [nsec]. The memory device equipped with the voltage production part 10 shown in FIG. 1 thus has a fatal defect of making a high speed operation impossible.

DETAILED DESCRIPTION OF THE PREFERRED EMBODIMENT

Figure 2:
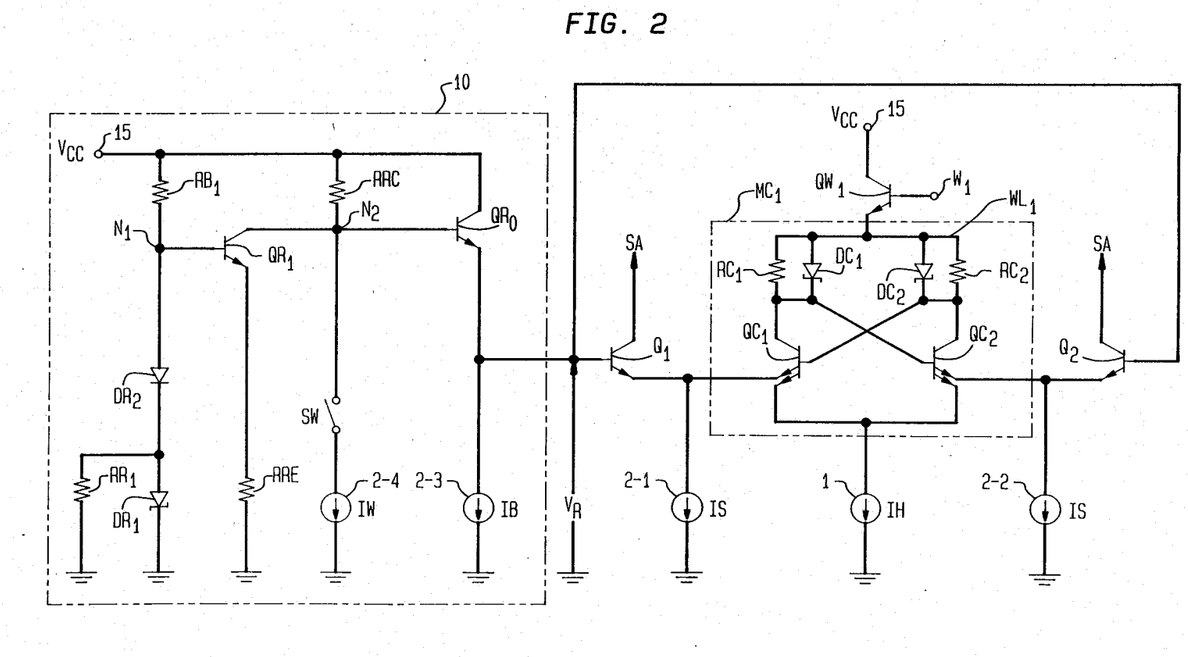
FIG. 2 is a circuit diagram representing a preferred embodiment of the present invention.

FIG. 2 shows a preferred embodiment according to the present invention, in which the same constituents as those shown in FIG. 1 are denoted by the same reference numerals to omit their description. In FIG. 2, the voltage production part 10 in a read/write control circuit according to the present invention includes two NPN transistors $QR_0$ and $QR_1$, four resistors RRC, RRE, RB, and $RB_1$, two diodes $DR_1$ and $DR_2$, a switch SW, and two constant current sources 2-3 and 2-4. The diode $DR_1$ is formed of Schottky diode similarly to the clamping dodes $DC_1$ and $DC_2$ in the memory cell $MC_1$, and the diode $DR_2$ is formed of a p-n junction diode using the base-emitter junction of a transistor. The resistor $RB_1$ and diodes $DR_2$ and $DR_1$ are connected in series between the terminal 15 and the ground point, and the resistor $RR_1$ is connected in parallel with the diode $DR_1$. The base of the transistor $QR_1$ is connected to the node $N_1$ of the resistor $RB_1$ and diode $DR_2$, and the emitter thereof is grounded through the resistor RRE. The collector of the transistor $QR_1$ is connected to the terminal 15 through the resistor RRC. The node $N_2$ of the transistor $QR_1$ and the resistor RRC is connected to the base of the transistor $QR_0$ and further grounded through the switch SW and current source 2-4. The collector of the transistor $QR_0$ is connected to the terminal 15, and the emitter thereof is grounded through the current source 2-3. Derived from the emitter of the transistor $QR_0$ is a reading-out voltage $V_R$ which is then supplied to the bases of the transistors $Q_1$ and $Q_2$.

Since the diodes $DR_1$ and $DR_2$ are biased by the current flowing through the resistor $RB_1$, the following voltage $V_{N1}$ appears at the node $N_1$:

$$V_{N1} = V_{F10} + V_{BE10} \tag{5}$$

where the voltages $V_{F10}$ and $V_{BE10}$ represent the forward voltages (or ON voltages) of the diodes $DR_1$ and $DR_2$, respectively, and their values are 0.5 [V] and 0.8 [V], respectively. The load circuit in the memory cell $MC_1$ is composed of the parallel connection circuit of the diode $DC_1$ ($DC_2$) and resistor $RC_1$ ($RC_2$), and the diode $DR_1$ and resistor $RR_1$ in the voltage production part 10 are connected in parallel. Accordingly, the ON voltages of the diode $DR_1$ and clamping diode $DC_1$ ($DC_2$) become equal to each other by making the current flowing through the resistor $RB_1$ equal to the current IS of the constant current source 2-1 (2-2). The voltage $V_{N1}$ at the node $N_1$ is used as a base bias voltage of the transistor $QR_1$. Since the diode $DR_2$ is formed of the base-emitter junction of a transistor as mentioned above, the forward voltage of the diode $DR_2$ is substantially equal to the base-emitter forward voltage of the transistor $QR_1$. Therefore, the voltage drop across the resistor RRE is made equal to the ON voltage of the diode $DR_1$. The emitter current $I_E$ of the transistor $QR_1$ thus takes the following value:

$$I_E = \frac{V_{F10}}{RRE} \tag{6}$$

In the data-read operation, the switch SW is brought into the open-state. The base current of the transistor $QR_1$ is negligible. Therefore, The voltage $V_{N2}$ at the node $N_2$ is:

$$V_{N2} = V_{CC} - \frac{RRC}{RRE} \cdot V_{F10} \tag{7}$$

As a result, the reading-out voltage $V_R$ derived from the emitter of the transistor $QR_0$ is:

$$V_R = V_{CC} - V_{BE20} - \frac{RRC}{RRE} \cdot V_{F10}, \tag{8}$$

$V_{BE20}$ being the base-emitter voltage of the transistor $QR_0$.

The current IB of the constant current source 2-3 is selected to be equal to the current IS of the current source 2-1 (2-2), and therefore, the base-emitter forward voltages ($V_{BE1}$ and $V_{BE20}$) of the transistors $QW_1$ and $QR_0$ are made equal to each other. Even if the currents IB and IS are different from each other, the voltages $V_{BE1}$ and $V_{BE20}$ may be substantially equal to each other. The resistance ratio between the resistors RRC and RRE is choosen to be 1:2. Accordingly, the reading-out voltages represented by the equations (1) and (8) are made equal to each other.

Thus, the voltage production part 10 shown in FIG. 2 also produces the reading-out voltage $V_R$ having the intermediate level between the potentials at bases of the transistors $QC_1$ and $QC_2$.

In addition, the time constant for reading out the data in this circuit 10 is below 1 [nsec]. More specifically, the resistance value of the resistor $RR_1$ should be selected to be equal to that of the resistor $RC_1$ ($RC_2$) in the memory cell $MC_1$, but the values of the resistors RRC and RRE can be designed indepently of the resistors $RC_1$ and $RC_2$. In this embodiment, the resistance values of the resistors RRC and RRE are choosen to take 200 [Ω] and 400 [Ω], respectively, (i.e., RRC/RRE=½). The output impedance of the voltage production part 10 is determined by the impedances of the emitter follower transistor $QR_0$ and the constant current source 2-3. The impedance of the constant current source 2-3 is extremely high, and therefore the output impedance of the circuit 10 is substantially equal to that of the transistor $QR_0$. The output impedance of the transistor $QR_0$ is determined by its current amplification gain $h_{FE}$ and the value of the resistor RRC, and represented by $RRC/h_{FE}$. Accordingly, the time constant for producing the reading-out voltage $V_R$ indicated by the equation (1) (or (8)) at the emitter of the transistor $QR_0$ is:

$$3[pF] \times 200[\Omega]/100 = 6[psec] \tag{9}$$

when $h_{FE}$ of the transistor $QR_0$ is 100 and the total capacitance of input capacitances and stray capacitances is 3 [pF].

The change in ON voltage of the respective clamping diodes $DC_1$ and $DC_2$ causes a similar change in ON voltage of the diode $DR_1$. Therefore, the reading-out voltage takes the intermediate level between the base potentials of the transistors $QC_1$ and $QC_2$, irrespective of the variation in potential at bases thereof.

The switch SW controls the data-read mode or data-write mode. When the switch SW is in an open stage, the memory device is brought into the data-read operation to produce the reading-out voltage $V_R$. The closed state of the switch SW brings the memory device into the data-write mode. In this case, the resistor RRC is supplied with the current IW from the constant current source 2-4 in addition to the collector current of the transistor $QR_1$. Consequently, the voltage drop across the resistor RRC becomes large to lower the emitter potential of the transistor $QR_0$. The data stored in the cell is not thereby read-out. The lowering of the reading-out voltage, i.e., the discharge of electric charges in the input capacitances of $Q_1$ and $Q_2$ and stray capacitance, is attained by the current IB of the constant current source 2-3. This current IB is also selected indepently of the current flowing through the memory cell $MC_1$, and thus takes a relatively large value, 3 [mA] for example. In this current value, the discharge time constant is about 0.5 [nsec].

Figure 3:
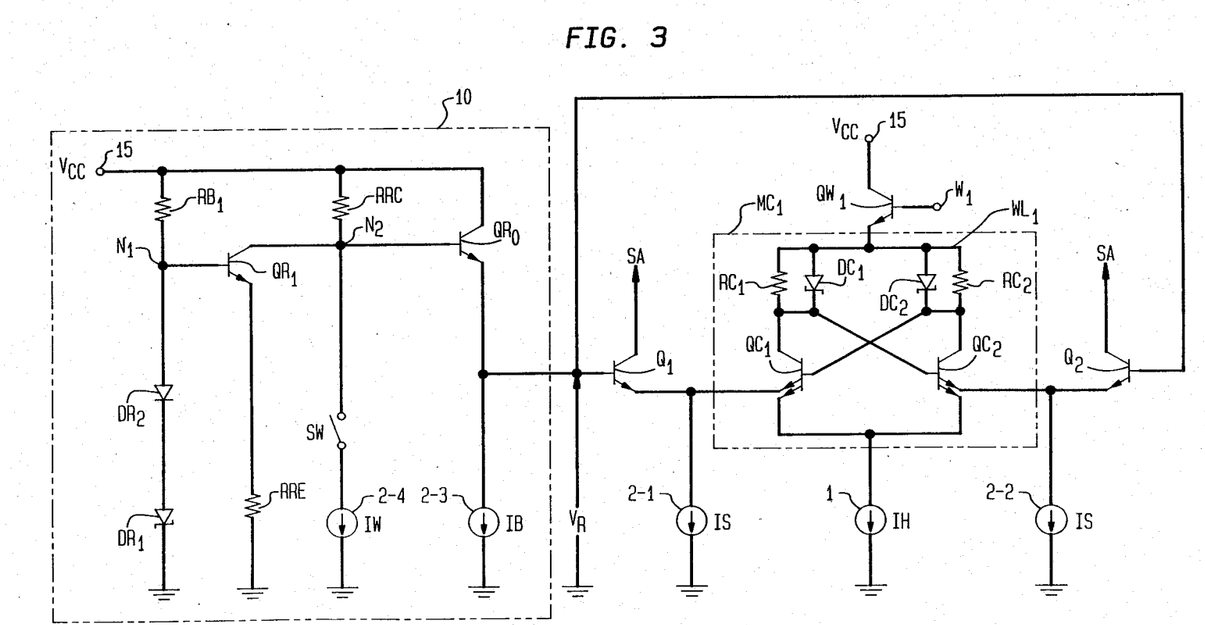
FIG. 3 is a circuit diagram showing another preferred embodiment of the present invention.

FIG. 3 shows another embodiment of the present invention, in which the same constituents as those in FIG. 2 are indicated by the same references. The circuit 10 shown in FIG. 3 does not include the resistor $RR_1$ connected in parallel with the diode $DR_1$. Accordingly, the current flowing through the diode $DR_1$ is changed by the following value:

$$0.5[V]/10[K\Omega] = 50[\mu A], \tag{10}$$

when the resistance value of the resistor $RR_1$ is 10 KΩ and the ON voltage $V_{F10}$ of the diode $DR_1$ is 0.5 [V]. This change causes the variation in ON voltage $V_{F10}$ by 3 [mV], but this variation in ON voltage is negligble in a practical use. Accordingly, the circuit shown in FIG. 3 has a simplified configuration, as compared with that in FIG. 2.

In FIGS. 2 and 3, the resistor $RB_1$ may be replaced by a constant current source. Further, it is possible that the power supply terminal 15 is applied with the ground potential and the ground potential point is replaced by a power supply terminal applied with $-V_{cc}$ potential.

As described above in detail, the present invention provides a bipolar memory device operating in a high speed and equipped with a read/write control circuit producing the reading-out voltage having a predetermined level.

Figures 4, 4A:
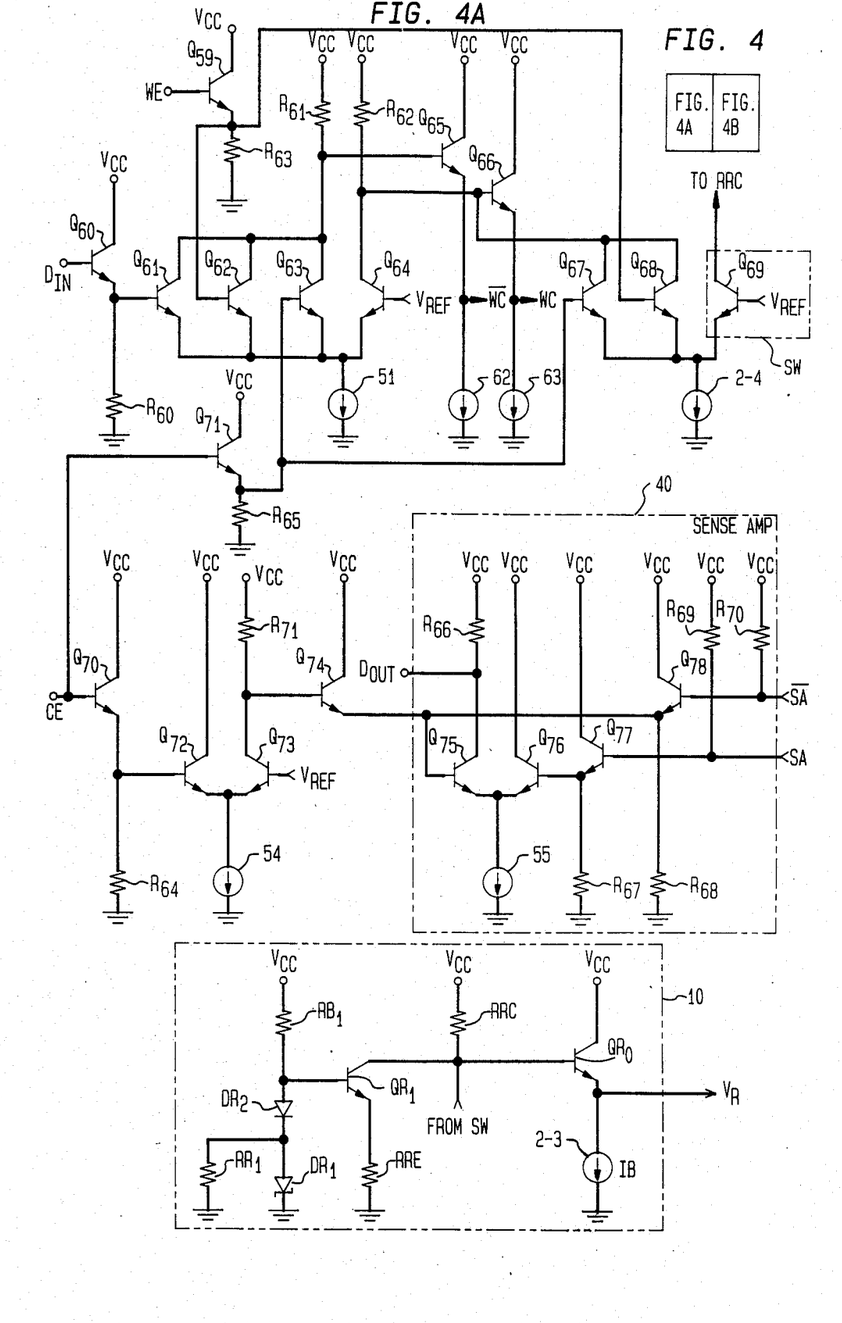
FIG. 4 is a circuit diagram showing a memory device according to the present invention.
Figure 4B:
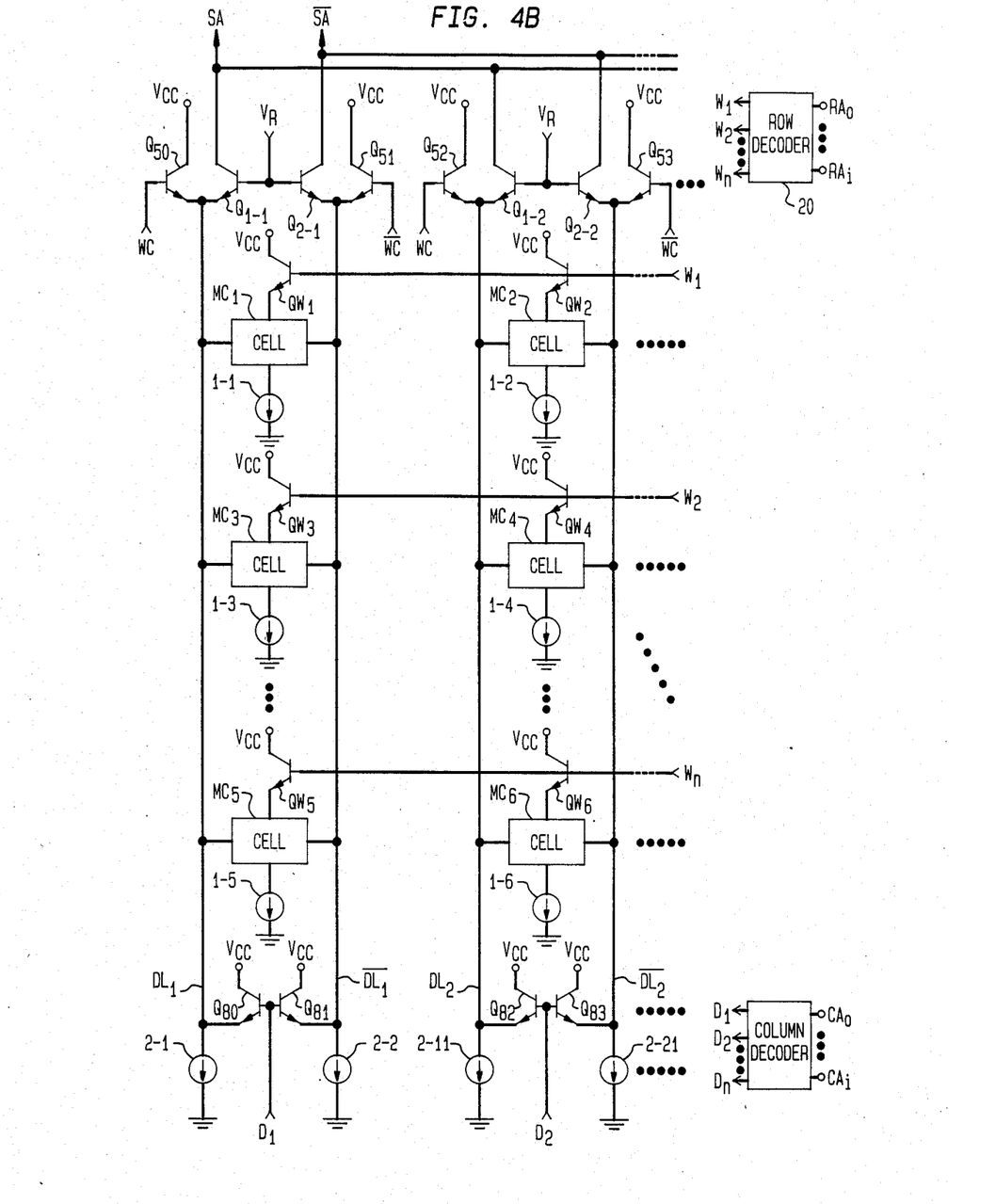

Referring to FIG. 4, the construction and operation of a memory device according to the present invention will be described. This memory device is controlled by a chip-select signal supplied to a chip-enable terminal CE. When the chip-select signal takes a high level, transistors $Q_{70}$ and $Q_{71}$ are turned on. The base voltage of a transistor $Q_{72}$ is thereby higher than a reference voltage $V_{ref}$ at the base of a transistor $Q_{73}$ to make transistors $Q_{74}$ and $Q_{75}$ conductive. As a result, the voltage at a data output terminal $D_{OUT}$ is held at a low level, irrespective of the levels of signals SA and $\overline{SA}$. In other words, the data-read operation is not carried out. The conduction of the transistor $Q_{71}$ turns transistors $Q_{63}$ and $Q_{67}$ on. Accordingly, a second write-control signal $\overline{WC}$ derived from a transistor $Q_{65}$ takes a low level. It should be noted that the collector current of the transistor $Q_{67}$ flows through a resistor $R_{62}$. The currents of constant current sources 2-4 and 52 are selected to be equal to each other, and therefore the voltage drops across the resistors $R_{61}$ and $R_{62}$ are equal to each other. As a result, a first write-control signal WC derived through a transistor $Q_{66}$ also takes a low level. The signals WC and $\overline{WC}$ thus take the low level to inhibit a data-write operation. As mentioned above, when the chip-select signal takes the high level, this memory device is unselected.

The memory device is selected by supplying the chip-enable terminal CE with the chip-select signal of the low level.

Row address signals are supplied to row address terminals $RA_0$ to $RA_i$. A row address decoder 20 makes the level of one of word signals $W_1$ to $W_n$ a selective level in response to the row address signals. The remaining ones of word signals $W_1$ to $W_n$ take an unselective level. Assuming that the signal $W_1$ takes the selectivel level (being substantial equal to Vcc level), memory cells $MC_1$ and $MC_2$ are selected by transistors $QW_1$ and $QW_2$ whose bases are supplied with the signal $W_1$. Each of memory cells $MC_1$ to $MC_6$ has the same configuration as shown in FIGS. 2 and 3.

Column address signals are supplied to column address terminals $CA_0$ to $CA_j$. A column decoder 30 makes the level of one of digit signals $D_1$ to $D_m$ a low level and remaining ones of digit signals a high level. If the digit signal $D_1$ takes a low level, transistors $Q_{80}$ and $Q_{81}$ are made nonconductive. On the other hand, other transistors (transistors $Q_{82}$ and $Q_{83}$ in FIG. 4) supplied with remaining digit signals are turned on. A pair of digit lines $DL_1$ and $\overline{DL_1}$ are thus selected. As a result, The memory cell $MC_1$ is designated.

In a data-read operation, a write-enable signal supplied to a write-enable terminal WE takes a high level. Transistors $Q_{59}$, $Q_{62}$ and $Q_{68}$ are thereby turned on. Accordingly, the second write-control signal $\overline{WC}$ takes the low level. It should be noted that the collector current of the transistor $Q_{68}$ also flows through the resistor $R_{62}$. As a result, the first write-control signal WC also takes the low level to inhibit the data-write.

Since the base voltage of the transistor $Q_{68}$ is higher than the reference voltage $V_{ref}$ applied to a transistor $Q_{69}$, the switch SW consisting of the transistor $Q_{69}$ is brought into an open-state. As a result, the reading-out voltage having a predetermined level is produced from the voltage production part 10 as described in FIG. 2.

If the data "1" is stored in the designated memory cell $MC_1$, the transistor $Q_{1-1}$ is made nonconductive, whereas the transistor $Q_{2-1}$ is made conductive. The collector outputs SA and $\overline{SA}$ of the transistors $Q_{1-1}$ and $Q_{2-1}$ are supplied to a sense amplifier 40. A voltage drop is thus produced only across a resistor $R_{70}$. Accordingly, transistors $Q_{76}$ and $Q_{77}$ are turned on, and transistors $Q_{75}$ and $Q_{78}$ are turned off. The data "1" having a high level is thus derived from the data-out terminal Dout.

In the data-write operation, the write-enable signal to the terminal WE takes a low level. The transistor $Q_{62}$ and $Q_{68}$ are thereby made nonconductive. The transistors $Q_{63}$ and $Q_{67}$ are in an off-state in a chip-select condition. Accordingly, the transistor $Q_{69}$ constituting the switch SW is turned on to lower the level of the reading-out voltage $V_R$. Both of the transistors $Q_{1-1}$ and $Q_{2-1}$ are thereby made nonconductive.

The level at a data-in terminal $D_{IN}$ controls whether the data to be written is "1" or "0". When the level at the terminal $D_{IN}$ takes a high level, transistors $Q_{60}$ and $Q_{61}$ are turned on. Accordingly, the second write-control signal WC takes the low level. At this time, the current of the current source 2-4 does not flow through the resistor $R_{62}$, and hence the first write-control signal $\overline{WC}$ takes a high level. Consequently, a transistor $Q_{50}$ is made conductive, whereas a transistor $Q_{51}$ is made nonconductive. The transistors $QC_1$ and $QC_2$ (FIG. 2) of the designated memory cell $MC_1$ are thus turned off and on, respectively. That is, the data "0" is stored in the cell $MC_1$.

On the contrary, the terminal $D_{IN}$ is applied with a low level,and a transistor $Q_{64}$ is turned on. The first and second write-control signals WC and $\overline{WC}$ thus take the low level and the high level, respectively. As a result, the data "1" is stored in the designated memory cell.

The circuit elements such as transistors, resistors and current sources shown in FIG. 4 are formed on one semiconductor substrate as an integrated circuit device.

The present invention is not limited to the above-mentioned embodiments, but may be changed and modified without departing from the scope and sprit of the present invention.

What is claimed is:

1. A memory device comprising a plurality of memory cells, each of said memory cells including first and second transistors for holding data stored therein and first and second diodes for suppressing a lowering of potentials of said transistors, a third transistor having an emitter connected to an emitter of said first transistor, a fourth transistor having an emitter connected to an emitter of said second transistor, a first current source connected to a connection point of the emitters of said first and third transistor, a second current source connected to a connection point of the emitters of said second and fourth transistors, means for generating a first voltage having a level variation characteristic substantially equal to that of each voltage of said first and second diodes, means for providing a current based on the first voltage generated from said generating means, means for converting said current into a second voltage, and means responsive to said second voltage for supplying a third voltage to bases of said third and fourth transistors with a low output impedance, said third voltage taking an intermediate level between potentials appearing at bases of said first and second transistors, whereby one of said third and fourth transistors is made conductive in response to the data stored in a selected memory cell.

2. The memory device as claimed in claim 1, wherein said generating means includes a third diode having a junction characteristic substantially equal to that of the first and second diodes, and said supplying means includes a fifth transistor of an emitter follower type.

3. A memory device comprising a plurality of memory cells, each of said memory cells including first and second transistors for holding data stored therein and first and second diodes for suppressing a lowering of potentials of said transistors, and means for producing a reading voltage which is used for reading out the data stored in the selected memory cell, said producing means including means for generating a voltage having a level variation characteristic substantially equal to that of each voltage of said first and second diodes, means for providing a current based on the voltage generated from said generating means, means for converting said current into a voltage, and means responsive to the converted voltage for supplying said reading-out voltage with a low output impedance, said generating means including a third diode having a junction characteristic substantially equal to that of the first and second diodes, said supplying means including a third transistor of an emitter follower type, said providing means including a fourth diode, a fourth transistor and a first resistor, and said converting means including a second resistor connected in series to the collector of said fourth transistor, said fourth diode, a base-emitter junction of said fourth transistor and said first resistor cooperating with said third diode to form a closed loop circuit, said fourth diode including a p-n junction substantially equal to the base-emitter junction of said fourth transistor.

4. A memory device comprising at least one pair of column lines, a plurality of memory cells each including a first transistor having an emitter connected to one of said column lines and a second transistor having an emitter connected to the other of said column lines, a third transistor having an emitter connected to said one column line, a fourth transistor having an emitter connected to said other column line, a first current source connected to said one column line, a second current source connected to said other column line, a sense amplifier coupled to collectors of said third and fourth transistors, a series circuit of first and second diodes, means for biasing said first and second diodes, a fifth transistor having a base supplied with a potential at one end of said series circuit, a first resistor connected between an emitter of said fifth transistor and the other end of said series circuit, a second resistor connected to a collector of said fifth transistor, and a sixth transistor having a base supplied with a potential at the collector of said third transistor and means for connecting an emitter of said sixth transistor to bases of said third and fourth transistors.

5. The memory device as claimed in claim 4, further comprising a third resistor connected in parallel to said second diode.

6. A memory device comprising a plurality of memory cells each including first and second transistors forming a flip-flop circuit, a first parallel circuit of a first resistor and a first diode provided as a load of said first transistor, and a second parallel circuit of a second resistor and a second diode provided as a load of said second transistor, a third transistor having an emitter connected to an emitter of said first transistor to form an emitter-coupled logic, a fourth transistor having an emitter connected to an emitter of said second transistor to form an emitter-coupled logic, and a read/write control circuit including a voltage producing section producing a voltage supplied to said third and fourth transistors, said voltage producing section including a fifth transistor of an emitter-follower type supplying said voltage to said third and fourth transistors with a low output impedance, said voltage taking an intermediate level between potentials appearing at bases of said first and second transistors, whereby one of said third and fourth transistors is turned ON in response to data stored in a selected memory cell.

7. The memory device as claimed in claim 6 further comprising a sense amplifier coupled to collectors of said third and fourth transistors and producing output data.

8. A memory device comprising a plurality of memory cells each including first and second transistors forming a flip-flop circuit, a first parallel circuit of a first resistor and a first diode provided as a load of said first transistor, and a second parallel circuit of a second resistor and a second diode provided as a load of said second transistor, a third transistor cooperating with said first transistor to form an emitter-coupled logic, a fourth transistor cooperating with said second transistor to form an emitter-coupled logic, and a read/write control circuit including a voltage producing section producing a voltage supplied to said third and fourth transistors, said voltage producing section including an impedance converter for supplying said voltage to said thitd and fourth transistors with a low output impedance, said impedance converter including a fifth transistor of an emitter follower type, wherein said voltage producing section further includes a third diode generating a voltage drop substantially equal to that of said first diode and a sixth transistor having an emitter resistor and a collector resistor and supplying said collector resistor with a current determined by the voltage drop of said third diode and said emitter resistor, the potential at the collector of said sixth transistor being supplied to said fifth transistor.

* * * * *